United States Patent [19]

Matsubara

[11] Patent Number: 4,937,789
[45] Date of Patent: Jun. 26, 1990

[54] MEMORY INTEGRATED CIRCUIT WITH AN IMPROVED STAND-BY MODE CONTROL CIRCUIT

[75] Inventor: Shoji Matsubara, Tokyo, Japan

[73] Assignee: NEC Corporation, Tokyo, Japan

[21] Appl. No.: 256,677

[22] Filed: Oct. 13, 1988

[30] Foreign Application Priority Data

Oct. 13, 1987 [JP] Japan .................................. 62-259004

[51] Int. Cl.⁵ ............................................. G11C 13/00
[52] U.S. Cl. ................................. 365/226; 365/189.09
[58] Field of Search .............. 365/228, 189.01, 189.05, 365/189.07, 189.09, 230.01

[56] References Cited

U.S. PATENT DOCUMENTS 4,754,185  6/1988  Gabriel et al. .

Primary Examiner—Terrell W. Fears
Attorney, Agent, or Firm—Sughrue, Mion, Zinn, Macpeak & Seas

[57] ABSTRACT

A memory circuit provided with an improved stand-by control circuit which is not affected by noise on a power supply voltage is disclosed. The memory circuit comprises a memory cell array, a peripheral circuit for performing an access operation to the memory cell array in an active state and holding data stored in the memory cell array in a stand-by state, a chip select input circuit receiving a chip select signal, a power voltage detection circuit for judging whether the power supply voltage is at a first value to be used in the active state or a second value lower than the first value to be used in the stand-by state, and a control circuit for enabling the chip select input circuit when the chip select signal is at its active level and the power supply voltage is at the first level and continuing to enable the chip select input circuit if the power supply voltage is changed to the second value under the active level of the chip select signal.

5 Claims, 4 Drawing Sheets

MEMORY INTEGRATED CIRCUIT WITH AN IMPROVED STAND-BY MODE CONTROL CIRCUIT

BACKGROUND OF THE INVENTION

1. Field of the Invention:

The present invention relates to a memory integrated circuit and, more particularly, to a CMOS type memory integrated circuit having data-retention function or stand-by function that holds stored data by a low power voltage supplied from a backup battery or the like.

2. Description of the Related Art:

A static semiconductor memory circuit, e.g. a CMOS static random access memory circuit (hereinafter abbreviated as CMOS SRAM), is frequently operated as a nonvolatile memory by holding internal data by means of a backup power source such as a battery, because a leak current in each input stage of an external signal controlled by a chip select signal (hereinafter abbreviated as $\overline{CS}$ signal) is virtually zero in a standby state wherein the $\overline{CS}$ signal is at a high, inactive level and, accordingly, a consumed current is very small only with a little holding current required for memory cells. A low supply voltage of about 2 V may be used for data holding.

An operation for holding internal data is conducted generally in the CMOS SRAM by raising the $\overline{CS}$ signal to a high inactive level such as a supply voltage $V_{CC}$ level. Then, an internal control signal outputted from an input inverter receiving the $\overline{CS}$ signal turns high. Thereby transistors provided in input stages receiving externally supplied signals other than the CS input inverter are controlled so that each input stage circuit is put in a non-active state, and the internal data are held by supplying a holding current for the memory cells from the backup power source.

The CMOS SRAM of this kind is usually provided with a supply voltage detecting circuit which detects that the value of the supply voltage falls below a reference voltage level. When the supply voltage falls below the reference voltage level, the input stages are also automatically put in the non-active state.

However, in the stand-by mode of the SRAM, if induced noise or the like is applied to the $\overline{CS}$ signal, the SRAM is erroneously put into an active state temporarily. In this instance, if an input terminal of a write control signal is at an active level (in a write mode), it sometimes happens that data at a data input terminal are erroneously written into the SRAM. Therefore, it is necessary to take, as a preventive measure, a means to keep the voltage level at the input terminal of the write signal at an inactive level such as a supply voltage $V_{CC}$ by means of an external resistance, or the like.

Moreover, if noise or the like is applied to the power supply line to temporarily lower the supply voltage at the supply line below the reference voltage during the active state of the SRAM, the input stages are erroneously put in the non-active state so that data stored in the memory cells are destroyed.

SUMMARY OF THE INVENTION

It is an object of the present invention to provide a memory integrated circuit provided with an improved stand-by mode control circuit which is not affected by noise or the like.

The semiconductor memory device according to the present invention comprises a supply voltage detecting circuit which detects application of a stand-by power voltage to the memory device in place of a normal power voltage, the stand-by power voltage enabling only to hold data stored in the memory device and having a smaller value than that of the normal power voltage, a first input stage receiving a chip select signal, at least one second input stage receiving an external input signal, and a control circuit for enabling the first and second input stages when the application of the normal power voltage is detected and the chip select signal is at its active level and continueing to enable them when the application of the stand-by voltage is detected under the active level of the chip select signal and disenabling the first and second input stages when the application of the stand-by power voltage is detected under the inactive level of the chip select signal.

According to the present invention, during an active state which is introduced into the memory circuit by applying the normal power voltage to the memory circuit and making the chip select signal at the active level, even if the supply voltage falls in the range of the stand-by power voltage due to noise or the like applied to the supply voltage, the first and second input stages are not disenabled. Accordingly, the active state can be continued without being interrupted by the noise or the like so that destruction of stored data can be prevented.

BRIEF DESCRIPTION OF THE DRAWINGS

The above and further objects, features and advantages of the present invention will become more apparent from the following detailed description taken in conjunction with the accompanying drawings wherein.

DETAILED DESCRIPTION OF THE INVENTION

The memory circuit in the prior art will be explained with referent to FIG. 1.

Figure 1:
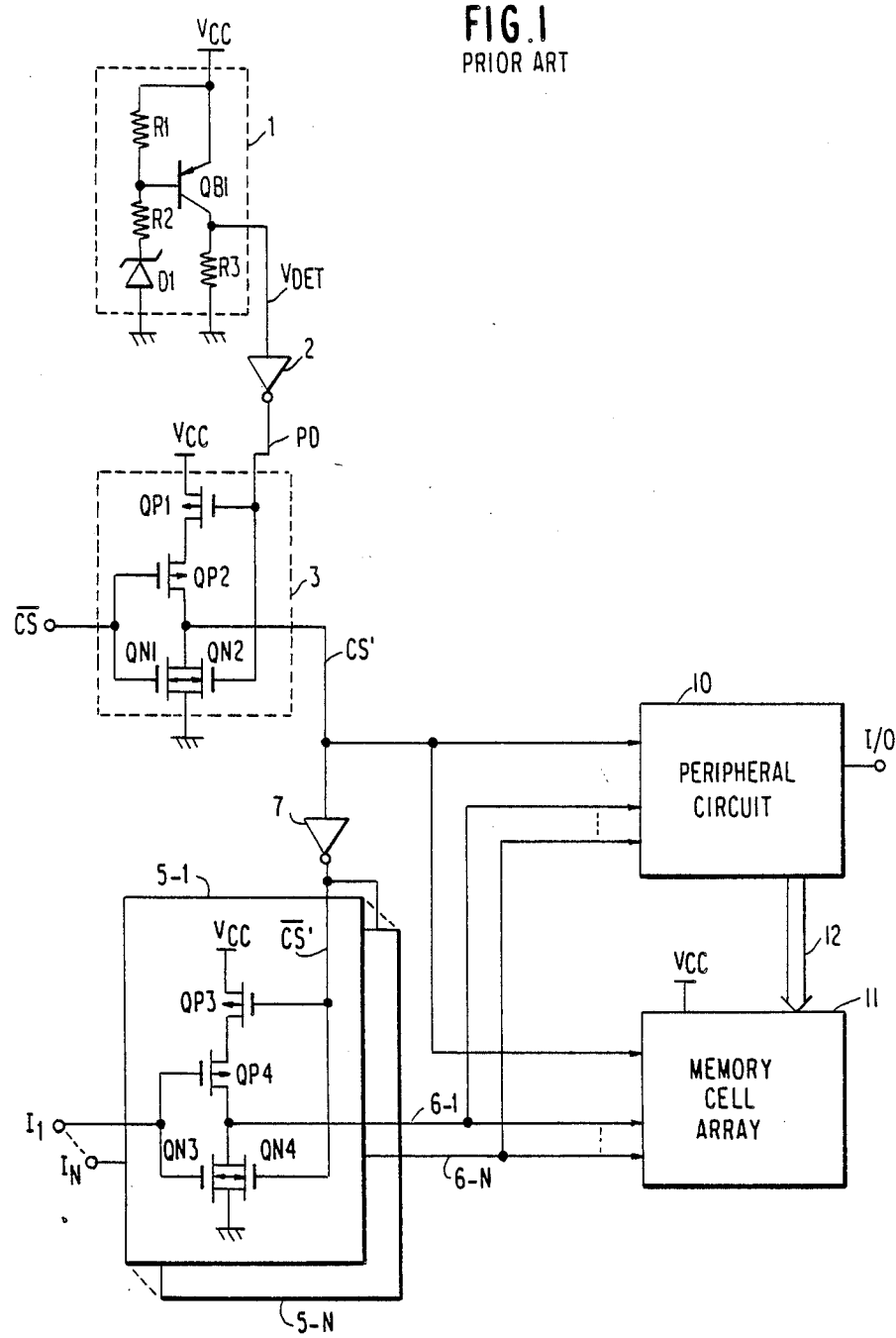
FIG. 1 is a schematic block diagram showing a memory circuit in the prior art.

The memory circuit of FIG. 1 comprises a power voltage detection circuit 1, an input stage 3 receiving a chip select signal, a plurality of input stages 5-1 to 5-N for receiving input signals $I_1$ to $I_N$ such as a read/write control signal, address signals or the like, a memory cell array 11 and a peripheral circuit 10 which controls a read or write operation of the memory cell array 11 through a control signal path 12 and produces a read out data or takes in a writed data at an I/O terminal I/O. The memory cell array 11 is energized through a power supply line Vcc.

The power voltage detection circuit 1 includes a bipolar transistor $Q_{B1}$, a Schottky diode whose breakdown voltage is used as a reference voltage ($V_R$) for judging the voltage at the power supply line Vcc as a normal power voltage e.g. 5 V or a stand-by power voltage e.g. 2 V, and resistors $R_1$ to $R_3$. The power voltage detection circuit 1 generates a detection signal $V_{DET}$ of the power supply voltage Vcc when the voltage Vcc exceeds the reference voltage $V_R$ and the signal $V_{DET}$ of a ground voltage when the power voltage Vcc is at the reference voltage $V_R$ or less. An inverter 2 receives the detection signal and generates a power down signal PD in response to the ground voltage of the detection signal $V_{DET}$. The input stage 3 is a CMOS type NOR circuit composed of P-channel MOS transistors $Q_{P1}$, $Q_{P2}$ and N-channel MOS transistors $Q_{N1}$, $Q_{N2}$ which receives the chip select signal $\overline{CS}$ and the power down signal PD. When the detection signal $V_{DE}$ is at the ground voltage and the power down signal PD is at a high (Vcc) level, an output, i.e. an internal chip select signal CS' of the input stage 3 is set at a low, ground voltage.

When the supply voltage Vcc exceeds the reference voltage $V_R$ and $V_{DET}$ and PD are at the Vcc level and the ground voltage, respectively, the input stage 3 generates the internal chip select signal CS' of the opposite phase with respect to $\overline{CS}$.

The input stages 5-1 to 5-N are CMOS type NOR circuits each composed of P-channel MOS transistors $Q_{P3}$, $Q_{P4}$ and N-channel MOS transistors $Q_{N3}$, $Q_{N4}$. Outputs 6-1 to 6-N of the input stages 5-1 to 5-N are applied to the peripheral circuit 10 and the memory cell array 11. An inverter 7 receives the internal chip select signal CS' to generate its inverted signal $\overline{CS'}$ which is applied to the input stages 5-1 to 5-N. The outputs 6-1 to 6-N of the input stages 5-1 to 5-N are set at the ground level when the supply voltage Vcc is at the reference voltage $V_R$ or less and the CS' signal is at the low level. While the input stages 5-1 to 5-N produces the output signals 6-1 to 6-N opposite to their input signals $I_1$ to $I_N$, respectively when the CS' signal is at high and the $\overline{CS'}$ signal is at low in level. The peripheral circuit 10 is disenabled and enabled when the CS' signal is at the high level and the low level, respectively. When the peripheral circuit 10 is disenabled, the memory cell array 11 is not accessed under control of the peripheral circuit 10 but holds data stored in memory cells thereof.

Figure 2:
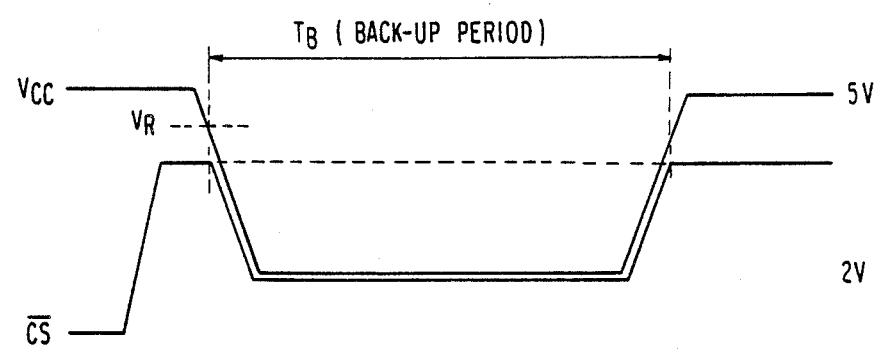
FIG. 2 is a timing diagram showing a back-up operation of the memory circuit in FIG. 1.

A back-up or stand-by operation of the memory circuit is illustrated in FIG. 2

Namely, during a period $T_B$ (back-up period) the supply voltage Vcc is made lower than the reference voltage so that the PD signal is at the low level and the CS' signal is at the low level. In this instance, the chip select signal $\overline{CS}$ is also lowered but it remains in a range of a logical "1" level. The chip select signal may be maintained at the high level as illustrated by a dotted line.

During the stand-by period, the input stages 3 and 5-1 to 5-N are disenabled to set their outputs at the low level so that stored data in the memory cell array 11 are held by the low level of the supply voltage, e.g. 2 volts. Thus, power consumption in the memory circuit is greatly reduced during the back-up or stand-by period $T_B$.

Figure 3:
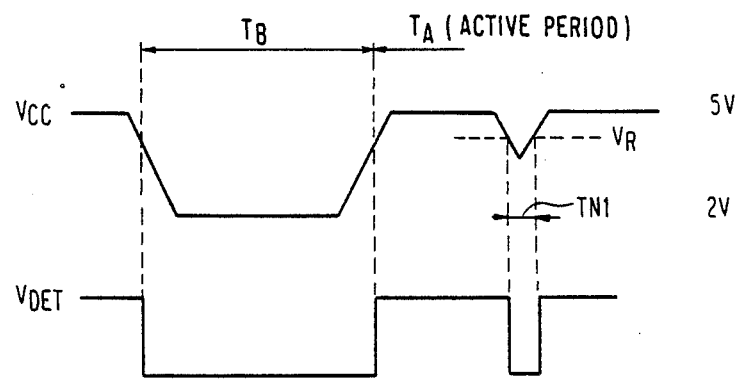
FIG. 3 is a wave-form diagram showing the back-up operation with noise applied to a power supply line in FIG. 1 circuit.

However, as shown in FIG. 3, if noise or the like is applied to the supply voltage Vcc when the the supply voltage Vcc should be at the normal operating voltage e.g. 5 volts during an active period $T_A$, the effective level of the supply voltage Vcc falls below the reference voltage $V_R$ temporarily during a period $TN_1$. Accordingly, the detection signal $V_{DET}$ is also made at the low level during the period $TN_1$ so that the input stages 3 and 5-1 to 5-N and the peripheral circuit are suddenly disenabled during the period $TN_1$. If a read or write operation is conducted by the peripheral circuit 10 during the period $TN_1$, the input stages and the peripheral circuit make malfunctions. Thus, data stored in the array 11 are destroyed.

Figure 4:
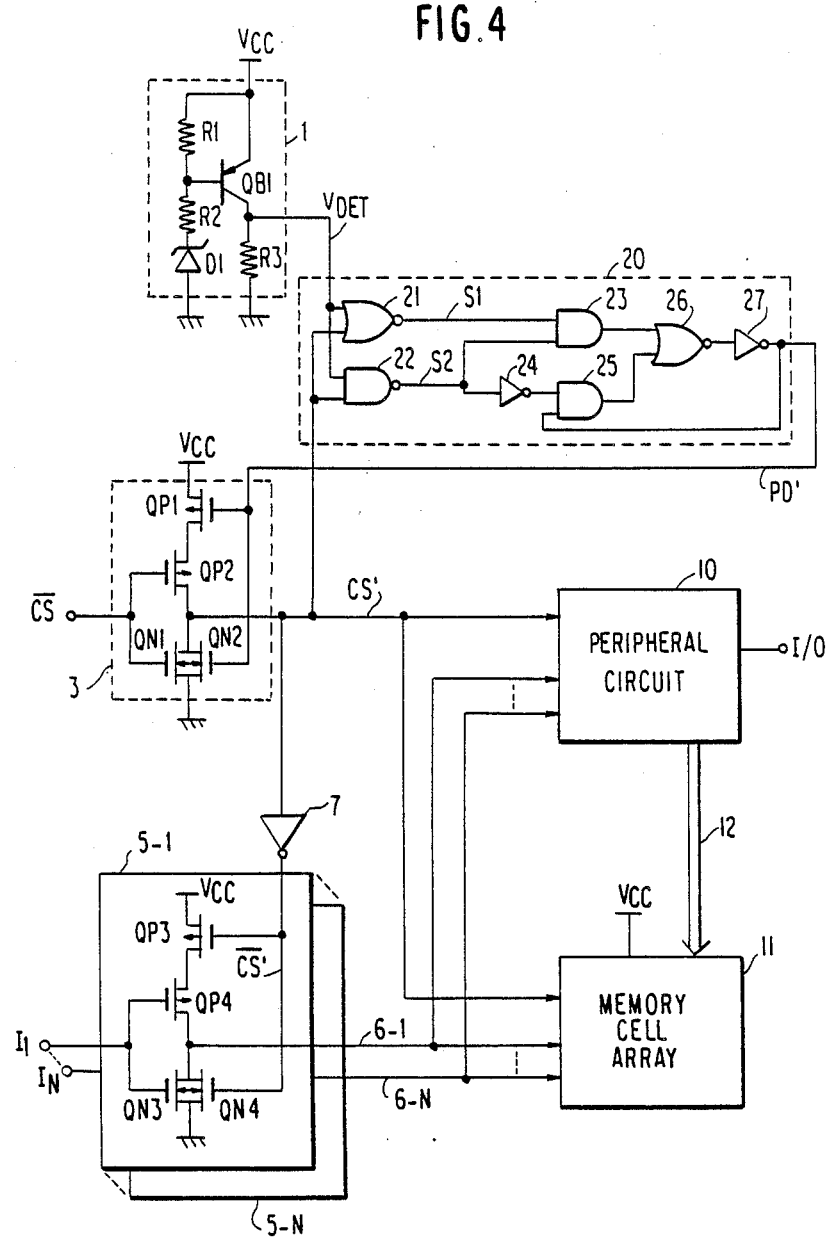
FIG. 4 is a schematic block diagram showing a memory circuit according to one embodiment of the present invention.

With reference to FIG. 4, the memory circuit according to one embodiment of the present invention will be explained.

In FIG. 4, the portions or elements corresponding to those in FIG. 1 are denoted by the same reference numbers and explanations on those portions or elements will not be repeated.

The present embodiment is achieved by employing a control circuit 20 which receives the detection signal $V_{DET}$ and the CS' signal from the input stage 3 and produces the power down signal PD'. The control circuit 20 includes a NOR gate 21 and a NAND gate 22 both receiving the signal $V_{DET}$ and CS' at their inputs, and a latch circuit composed of AND gates 23, 25, a NOR gate 26 and inverters 24, 27.

Figure 5:
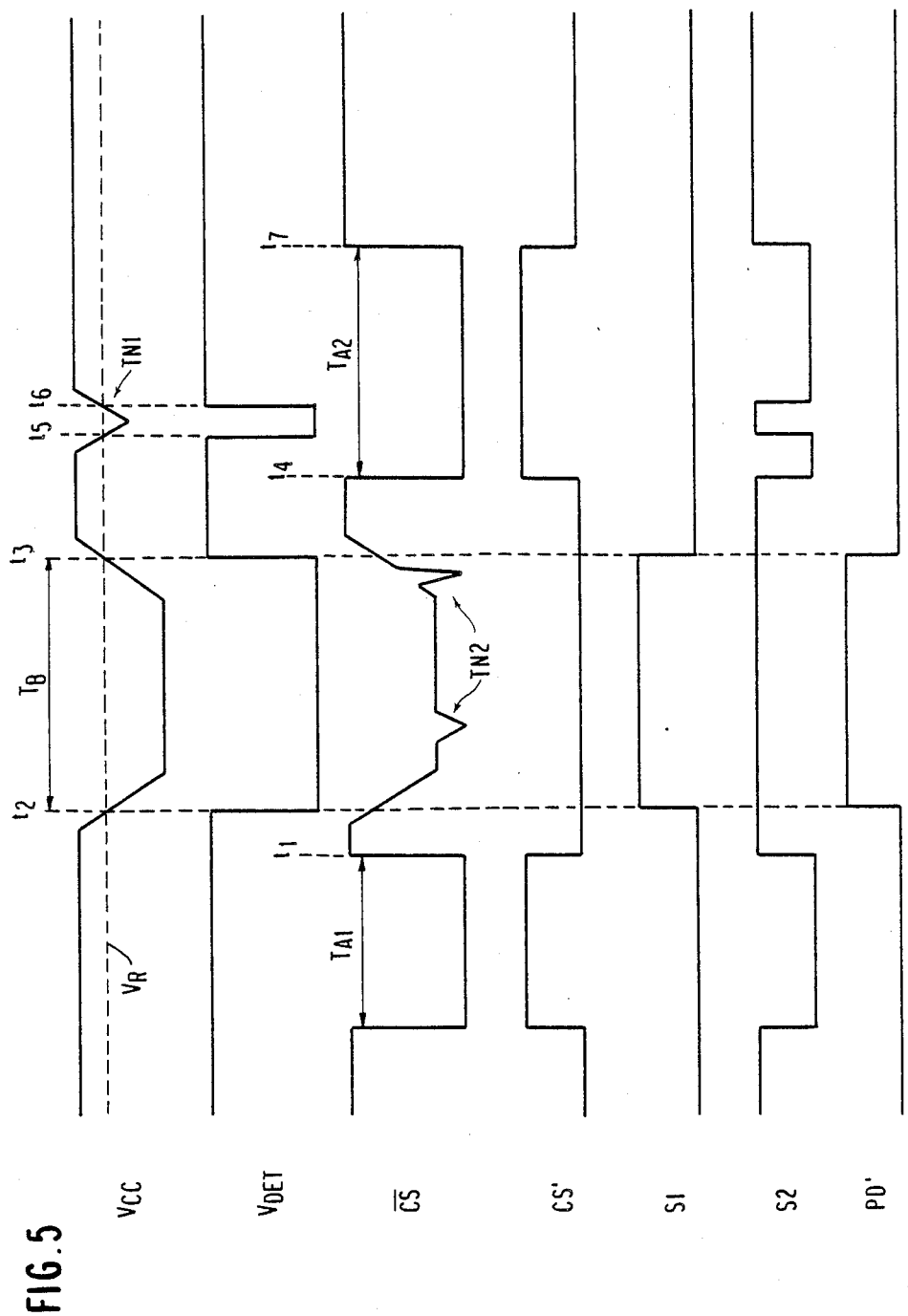
FIG. 5 is a timing diagram showing operations of the memory circuit in FIG. 1.

Operations of the memory circuit of FIG. 4 will be explained with reference to FIG. 5

During an active period $T_{A1}$ in which the supply voltage Vcc is above the reference voltage (the lower limit of the operating value of the supply voltage, e.g. 3 V) and the chip select signal is at the active (low) level, the signals $V_{DET}$ and CS' are at the high level so that the NOR output signal S1 and the NAND output signal S2 are at the low level. Therefore, the signal PD' is at the low level and the input stages 3 and 5-1 to 5-N are enabled to be responsive to their input signals so that the memory circuit is activated.

A stand-by period $T_B$ is then introduced in the following way.

First, the chip select signal $\overline{CS}$ is changed to the inactive (high) level at a time point $t_1$ under the supply voltage Vcc above the reference voltage so that the signal CS' is turned to the low level. Therefore, the NAND output signal S2 changes to the high level, but the signal PD' is still at the low level. Then, at a time point $t_2$, the supply voltage Vcc falls below the reference voltage. Accordingly, the signal $V_{DET}$ is changed to the low level so that the NOR output signal S1 is made at the high level that the signal PD' is changed to the inactive (high) level. As a result, the transistor QP1 in the input stage 3 of CS' is turned non-conductive so that the output of the input stage 3, i.e. the signal CS' is changed to the active (low) level. Accordingly, the output $\overline{CS'}$ of the inverter is changed to its inactive (high) level so that the transistor QP3 in each of the input stages 5-1 to 5-N is turned non-conductive so that the input stages 5-1 to 5-N are disenabled. Thus, the stand-by period $T_B$ is introduced into the memory circuit and the memory circuit simply holds stored in the memory cell array. During the stand-by period $T_B$, if noise is applied to the chip select signal $\overline{CS}$ and the signal $\overline{CS}$ is temporarily changed to the active (logic "0"). level as shown by a reference $TN_2$, these noise are not taken into the memory circuit, that is the input stage 3, because the input stage 3 is disenabled during the stand-by period $T_B$. Therefore, these noise does not affect the memory circuit.

At a time point $t_3$, the supply voltage Vcc is raised above the reference voltage $V_R$ and the signal $V_{DET}$ is changed to the high level. In response to the high level of $V_{DET}$, the NOR output signal S1 is changed to the low level and therefore the signal PD' is changed to its active (low) level so that the transistor QP1 of the $\overline{CS}$ input stage 3 is made conductive and the input stage 3 is enabled to terminate the stand-by period $T_B$.

Then, at a time point $t_4$, the chip select signal is activated to the low level and therefore the signal CS' is changed to the high level and the signal $\overline{CS'}$ is changed to the low level. Thus, the transistors QP3 in the input stages 5-1 to 5-N are made conductive and the input stages are enabled. As a result, the active period TA2 is introduced in the memory circuit. During the active period TA2, if a noise TN1 is applied to the supply voltage Vcc to make the supply voltage Vcc below the reference voltage $V_R$ temporarily during a period of $t_5$ to $t_6$, the signal $V_{DET}$ is changed to the low level during this period. Therefore, the NAND output S2 is changed to the high level temporarily. However, the signal PD' still at the low level. Accordingly, the input stages 3 and 5-1 to 5-N are all maintained at the enabled state. Therefore, the operation of the memory circuit is continued without being influenced by the noise applied to the supply voltage during the active period.

I claim:

1. A memory circuit which performs an access operation to a memory cell array of memory cells thereof in an active state in which a power supply voltage is at a first value and holds data stored in said memory cell array in a stand-by state in which the power supply voltage is at a second value lower than said first value, comprising a power voltage terminal receiving said power supply voltage; a power voltage detection circuit coupled to said power voltage terminal and generating a first level of detection signal when said power supply voltage is at said first value and a second level of detection signal when said power supply voltage is at said second value; a first input terminal receiving a chip select signal taking one of active and inactive levels; a first input circuit having an input terminal coupled to said first input terminal, a control terminal for receiving a control signal taking one of third and fourth levels and an output terminal, said first input circuit producing at its output terminal an active level of internal signal and an inactive level of internal signal in response to the active level of chip select signal and the inactive level of chip select signal, respectively, when said control signal is at said third level and the inactive level of internal signal when said control signal is at the fourth level; a control circuit having a first input terminal receiving said detection signal, a second input terminal receiving said internal signal and an output terminal for generating said control signal, said control circuit generating the control signal of said third level when said detection signal is at the first level and said chip select signal is at the active level and continueing to generate the control signal of said third level when said detection signal is changed to said second level under the active level of said chip select signal and generating the control signal of said fourth level when said detection signal is changed to the second level from the first level under said active level of said chip select signal; at least one second input circuit having a input terminal receiving an external signal and an output terminal generating an output signal; control means coupled to said second input circuit for enabling said second input circuit when said internal signal is at the active level and disenabling said second input circuit when said internal signal is at the inactive level; a memory cell array having a plurality of memory cells supplied a power through said power voltage terminal; and a peripheral circuit coupled to said memory cell array and said first input circuit for performing an access operation to said memory cell array when said internal signal at the active level.

2. The memory circuit according to claim 1, in which said control circuit includes a latch circuit, a NOR circuit receiving said detection signal and said internal signal and a NAND circuit receiving said detection signal and said internal signal.

3. The memory circuit according to claim 1, in which said first input circuit includes a NOR gate having a first input end serving as the input terminal of said first input terminal and a second input end serving as the control terminal of said first input circuit.

4. The memory circuit according to claim 1 in which said power voltage detection circuit includes a first resistor connected between said power voltage terminal and a first node, a series circuit of a second register and a diode connected in series between said first node and a ground voltage source, a switch transistor having a current path connected between said power voltage terminal and a second node and a control electrode connected to said first node and a third resistor connected between said second node and said ground voltage source.

5. A memory circuit comprising a memory cell array, a periphercal circuit for performing an access operation to the memory cell array in an active state and holding data stored in the memory cell array in a stand-by state, a chip select input circuit receiving a chip select signal, a power voltage detection circuit for judging whether a power supply voltage is at a first value to be used in said active state or a second value lower than said first value to be used in said stand-by state, and a control circuit for enabling the chip select input circuit when the chip select signal is at its active level and the power supply voltage is at the first level and continueing to enable the chip select input circuit if the power supply voltage is changed to the second value under the active level of the chip select signal.

* * * * *

UNITED STATES PATENT AND TRADEMARK OFFICE
CERTIFICATE OF CORRECTION

PATENT NO. : 4,937,789

DATED : June 26, 1990

INVENTOR(S) : Shoji Matsubara

It is certified that error appears in the above-identified patent and that said Letters Patent is hereby corrected as shown below:

Column 4, line 16, delete "signal" and insert --signals--.

Column 4, line 21, delete "$T_{A1}$" and insert --$TA_1$--.

Column 4, line 44, delete "CS'" and insert --$\overline{CS}'$--.

Column 4, line 59, delete "noise does" and insert --noises do--.

Column 5, line 13, after "PD'" insert --is--.

Signed and Sealed this

Seventh Day of April, 1992

Attest:

HARRY F. MANBECK, JR.

*Attesting Officer*      *Commissioner of Patents and Trademarks*